United States Patent
Haddy et al.

(10) Patent No.: US 11,531,133 B2
(45) Date of Patent: Dec. 20, 2022

(54) BURIED ASSET DETECTION SIMULATOR USING DUAL USE RETROFITTED ELECTROMAGNETIC LOCATE DEVICE

(71) Applicant: UTTO INC., Naples, FL (US)

(72) Inventors: Alan Haddy, Naples, FL (US); Nickolas Markoff, Naples, FL (US)

(73) Assignee: UTTO INC., Naples, FL (US)

( * ) Notice: Subject to any disclaimer, the term of this patent is extended or adjusted under 35 U.S.C. 154(b) by 32 days.

(21) Appl. No.: 17/177,871

(22) Filed: Feb. 17, 2021

(65) Prior Publication Data

US 2022/0260744 A1 Aug. 18, 2022

(51) Int. Cl.
| | |
|---|---|
| *G01V 3/08* | (2006.01) |
| *G01V 3/10* | (2006.01) |
| *G01V 3/12* | (2006.01) |
| *H04W 84/18* | (2009.01) |
| *G06F 30/34* | (2020.01) |
| *G01V 3/15* | (2006.01) |
| *H04B 17/318* | (2015.01) |
| *E21B 47/024* | (2006.01) |
| *E21B 47/0232* | (2012.01) |
| *E21B 47/092* | (2012.01) |

(52) U.S. Cl.
CPC ............ *G01V 3/12* (2013.01); *G01V 3/08* (2013.01); *G01V 3/081* (2013.01); *G01V 3/15* (2013.01); *G06F 30/34* (2020.01); *H04W 84/18* (2013.01); *E21B 47/024* (2013.01); *E21B 47/0232* (2020.05); *E21B 47/092* (2020.05); *H04B 17/318* (2015.01)

(58) Field of Classification Search
CPC ... G01V 3/12; G01V 3/08; G01V 3/15; G01V 3/081; G06F 30/34; H04W 84/18; H04B 17/318; E21B 47/024; E21B 47/0232; E21B 47/092
USPC .................................. 324/67, 323, 326, 376
See application file for complete search history.

(56) References Cited

U.S. PATENT DOCUMENTS

2020/0349496 A1* 11/2020 Irwin .................. G06Q 10/083
2021/0366251 A1* 11/2021 Volkerink .......... G06K 19/0717
2021/0368635 A1* 11/2021 Haddy ................ H01Q 1/1235

* cited by examiner

*Primary Examiner* — Raul J Rios Russo
(74) *Attorney, Agent, or Firm* — Mark Terry

(57) ABSTRACT

A printed circuit card assembly (PCBA) configured for retrofitting a conventional electromagnetic locator device (ELD) for a simulator system includes a printed circuit board (PCB) having data connectors connected via a switch to the ELD, a low-power radio frequency (RF) receiver for receiving emulated electromagnetic (EM) field data, a processor for reading the emulated EM field data that includes constituent parts, wherein each constituent part corresponds to EM field data for a specific one of the digital signal processor on the conventional ELD, disassembling the emulated EM field data into its constituent parts, and transmitting to the digital signal processors, via the data connectors, the constituent part of the emulated EM field data that corresponds to said digital signal processor, thereby emulating an EM field on the conventional ELD.

8 Claims, 12 Drawing Sheets

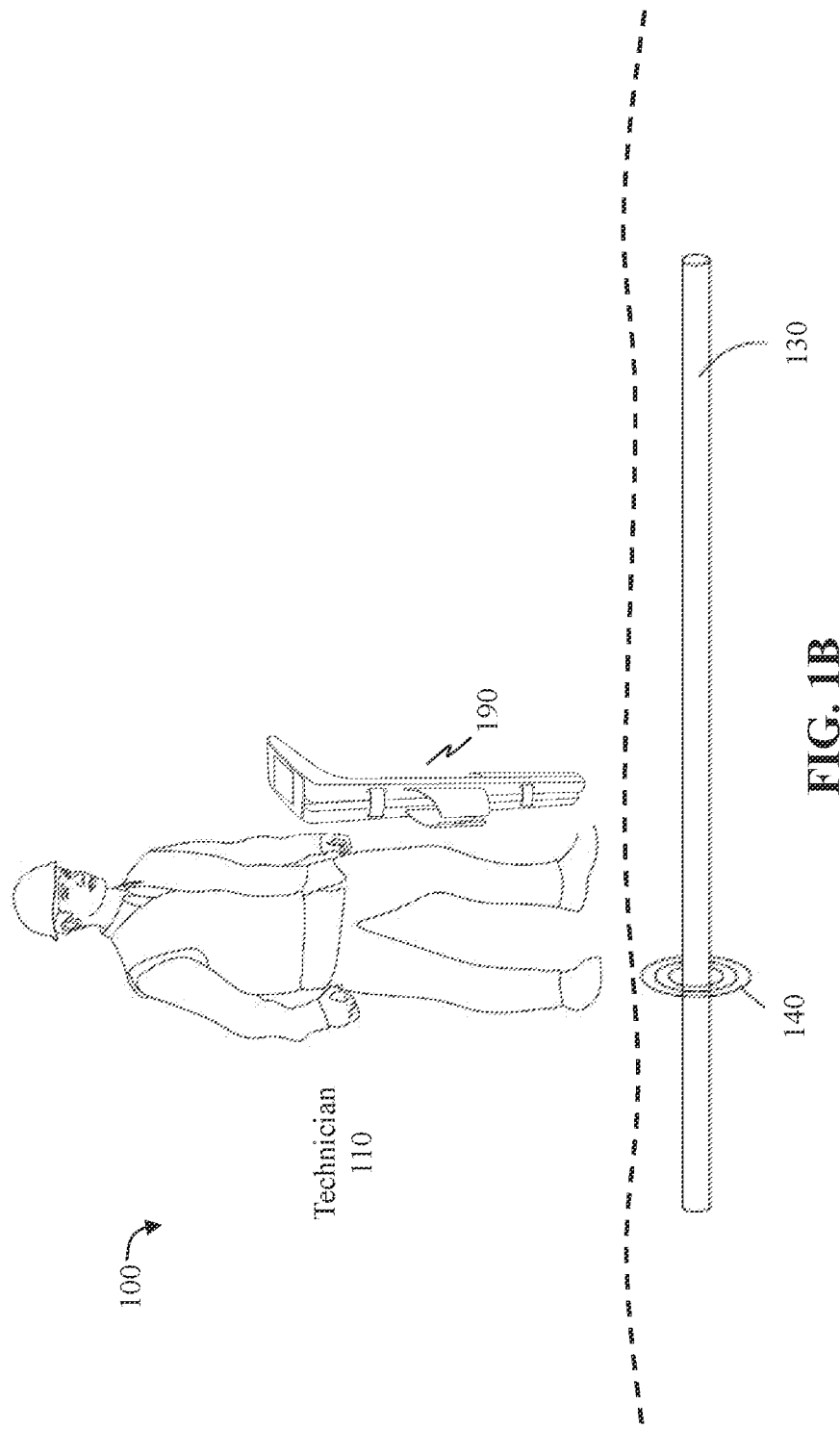

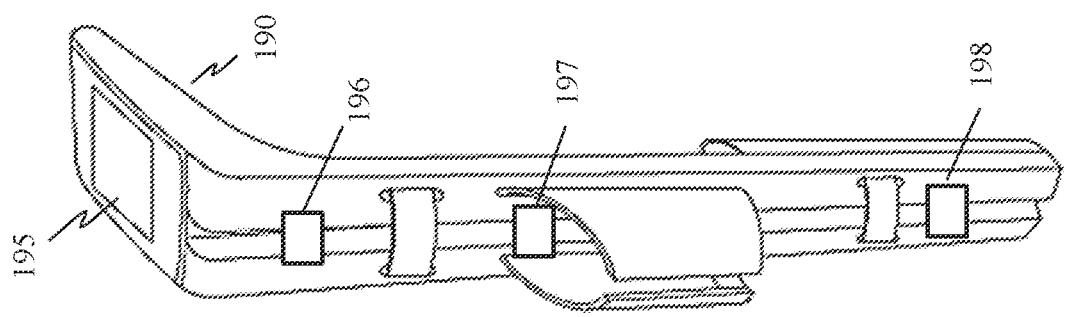

BURIED ASSET DETECTION SIMULATOR USING DUAL USE RETROFITTED ELECTROMAGNETIC LOCATE DEVICE

CROSS-REFERENCE TO RELATED APPLICATIONS

Not Applicable.

STATEMENT REGARDING FEDERALLY SPONSORED RESEARCH OR DEVELOPMENT

Not Applicable.

INCORPORATION BY REFERENCE OF MATERIAL SUBMITTED ON A COMPACT DISC

Not Applicable.

TECHNICAL FIELD

The technical field relates generally to the detection and identification of buried assets (i.e., underground utility lines) and, more specifically, to training personnel in the procedures and techniques of detecting and identifying buried assets.

BACKGROUND

Utility lines, such as lines for telephones, electricity distribution, natural gas, cable television, fiber optics, Internet, traffic lights, streetlights, storm drains, water mains, and wastewater pipes, are often located underground. Said utility lines described above are referred to as "buried assets" herein. Consequently, before excavation occurs in an area, especially an urban area, an excavator is typically required to clear excavation activities with the proper authorities and service providers. The clearance procedure usually requires that the excavator contact a central authority (such as "One Call", "811" and "Call Before You Dig," which are well known in the art) which, in turn, sends a notification to the appropriate utility companies. Subsequently, each utility company must perform a buried asset detection procedure, which includes having a field technician visit the proposed excavation site, detecting the relevant buried assets and physically marking the position of the buried asset using temporary paint or flags.

Usually, a field technician visiting a proposed excavation site utilizes a portable electronic device known as a pipe or cable locator, an electromagnetic locate device ("ELD"), an electromagnetic locator, a buried asset locate device, or a buried asset locator (collectively referred to herein as an "ELD"). Said ELDs are commercial, off-the-shelf, devices employed to detect and identify the position of buried assets. ELDs are usually used in conjunction with a transmitter, so as to create a field that can be detected by the ELD. This is typically achieved by connecting the transmitter to a suitable connection point (i.e., pedestal, hydrant, manhole, removable cover, lid, junction box or other access point) of the buried asset, wherein the transmitter sends a signal of a specific frequency onto the buried asset. Subsequently, the ELD is "tuned" to the specific frequency in order to locate the resulting electromagnetic signal radiating from the buried asset, thus enabling the position and route of the buried asset to be marked with paint or flags above surface. Best practice standards require the operator perform very specific and consistent physical motions with the ELD such as sweeping, rotating and lifting, all while the ELD must be orientated correctly to the plane of the buried asset to ensure correct geometric alignment with the radiated electromagnetic field. The process of detecting and marking out a buried asset using an ELD is referred to herein as a buried asset locate procedure, buried asset location procedure, or a buried asset detection procedure.

The aforementioned buried asset location procedure, however, takes time and training to master. There are a variety of techniques that the field technician must learn in order to perform buried asset location procedures in a way that meets best practice standards. Often, the field technician may spend a significant amount of time at a training facility learning proper techniques and then perform an apprenticeship afterwards. After completing the aforementioned training and apprenticeship, field technicians then commence work performing buried asset location procedure.

The training for process for buried asset location procedures, however, can be long and tedious for field technicians. Typically, field technicians in training must be taken, in person, to real-life buried asset situations so that the technician may perform the learned procedures on actual buried power lines, data lines, etc. Said training scenarios, however, can be costly and time consuming to build, as they require that actual utility lines and cables are buried at various depths. This problem is compounded by the fact that real life training scenarios such as these are static and cannot be changed. As a result, technicians in training tend to learn the position of said buried assets after testing on said training scenarios more than once. Consequently, the real-life training scenarios described above are of limited utility.

Additionally, though prior art approaches to address said problems with the prior art do exit, they are fraught with drawbacks. One of said approaches describes a simulator that includes a fully simulated buried asset and a fully simulated ELD. This approach, however, has several disadvantages. First, this approach can be costly and time consuming to develop, as it requires that an entire ELD is developed from scratch. This requires a full and detailed understanding of the inner components of a conventional ELD, as well as the ability to emulate the ELD. Second, this approach is disadvantageous because it requires that a fully simulated conventional ELD exhibits real time responses to a fully simulated electromagnetic field. This can be difficult to accomplish, as electromagnetic fields are complex to model. Third, the use of a fully simulated ELD is disadvantageous because it requires that the trainee learn to use the simulated ELD. The majority of the field technician corps are well versed in the use of conventional ELDs. It is wasteful to have field technicians learn to use a new ELD solely for the purposes of training. Lastly, the use of a fully simulated ELD is disadvantageous because it requires that the trainee learn to use a simulated ELD that is different from the use of conventional ELDs on the market and in the field. Again, it is wasteful to have field technicians learn to use a new ELD, which does not correspond to the method of use of conventional ELDs.

Furthermore, there are solutions for simulating ELDs by modifying a conventional ELD, such as that described in U.S. Pat. No. 10,304,351. This solution, however, has the drawback that it entails permanently and irreversibly modifying the conventional ELD on a hardware level such that it can no longer be used for conventional buried asset location tasks. This can be problematic for businesses that do not have large numbers of ELDs or that simply do not have an ELD to spare for training tasks. This can also be costly, as conventional ELDs have a large price tag that is difficult to absorb for smaller businesses. Lastly, once a conventional ELD is permanently and irreversibly modified, it may lay unused for long periods of time, which is neither efficient nor optimal.

Therefore, a need exists for improvements over the prior art, and more particularly for more efficient methods and systems for training field technicians in proper buried asset locate procedures.

SUMMARY

A printed circuit card assembly (PCBA) configured for retrofitting a conventional electromagnetic locator device (ELD) for a simulator system is provided. This Summary is provided to introduce a selection of disclosed concepts in a simplified form that are further described below in the Detailed Description including the drawings provided. This Summary is not intended to identify key features or essential features of the claimed subject matter. Nor is this Summary intended to be used to limit the claimed subject matter's scope.

In one embodiment, the PCBA includes a printed circuit board (PCB) including a plurality of electrical components, at least one orifice in the PCB configured for fastening to the conventional ELD, a first communications bus for transferring data, a first power network for distributing power, a power connector configured for conductively coupling the first power network with a power network on the conventional ELD, at least three data connectors, each data connector configured for communicatively coupling with a separate one of at least three digital signal processors on the conventional ELD, a switch that, upon activation by the user, communicatively couples the at least three data connectors with the at least three digital signal processors, a low-power radio frequency (RF) receiver communicatively coupled with the first communications bus and conductively coupled with the first power network, the RF receiver configured for receiving, over RF, emulated electromagnetic (EM) field data, a processor communicatively coupled with the first communications bus and conductively coupled with the first power network, the processor configured for: a) reading the emulated EM field data received by the RF receiver, which comprises at least three constituent parts, wherein each constituent part corresponds to EM field data for a specific one of the at least digital signal processors on the conventional ELD, b) disassembling the emulated EM field data into said at least three constituent parts, and c) transmitting an amplified digital signal to each one of the at least three digital signal processors on the conventional ELD, via the at least three data connectors, the constituent part of the emulated EM field data that corresponds to said digital signal processor, thereby emulating an EM field on the conventional ELD.

BRIEF DESCRIPTION OF THE DRAWINGS

The accompanying drawings, which are incorporated in and constitute a part of this disclosure, illustrate various example embodiments. In the drawings:

FIG. 1B is a diagram of a conventional operating environment for a standard buried asset location procedure;

FIG. 1E is a diagram of a conventional ELD;

DETAILED DESCRIPTION

Figure 1A:
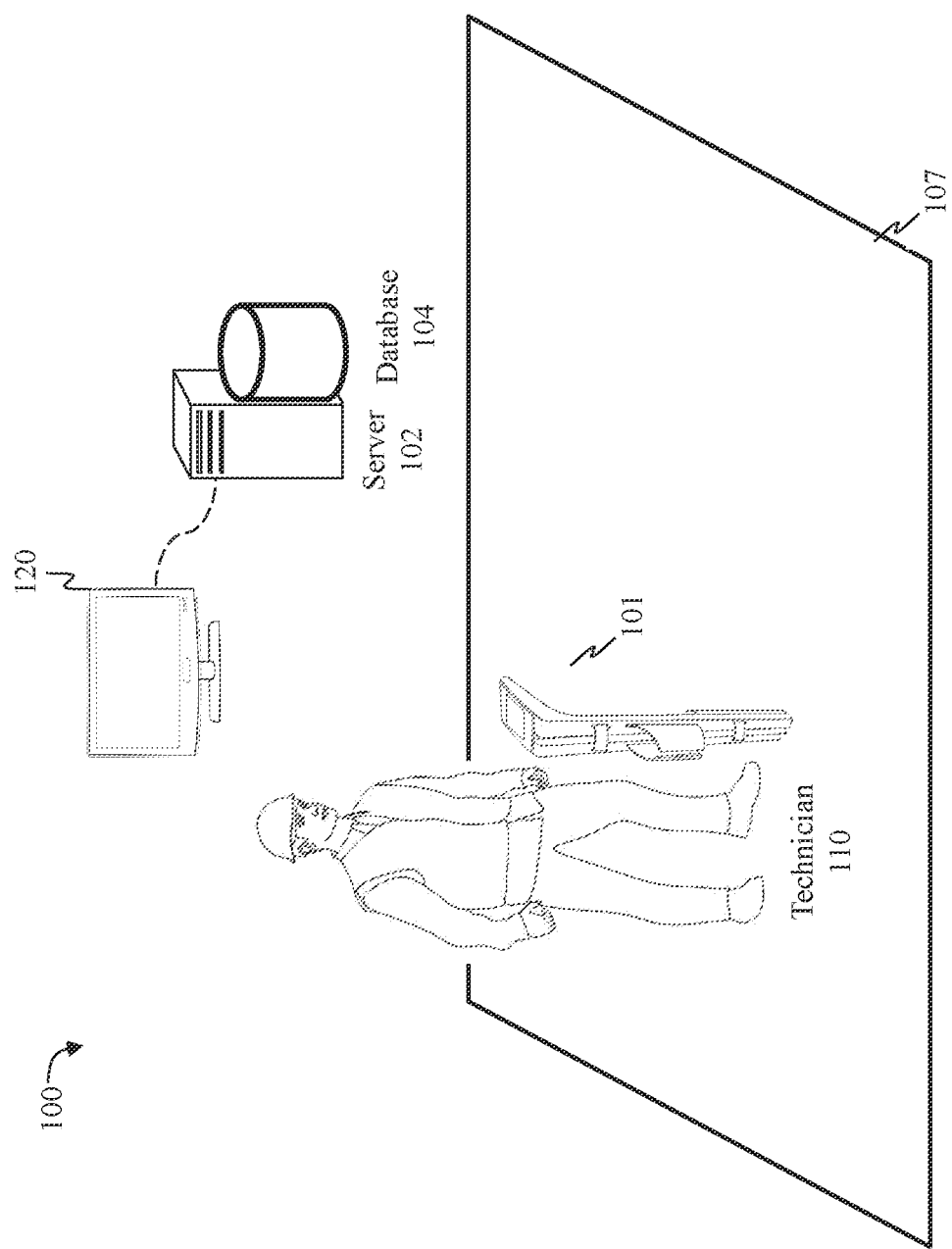
FIG. 1A is a diagram of an operating environment that supports a system for simulating a buried asset location procedure in a defined space, according to an example embodiment.

The following detailed description refers to the accompanying drawings. Wherever possible, the same reference numbers are used in the drawings and the following description to refer to the same or similar elements. While embodiments may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the claimed subject matter. Instead, the proper scope of the claimed subject matter is defined by the appended claims.

The claimed subject matter improves over the prior art by providing a realistic simulator for training field technicians in buried asset locate procedures for quality control and quality assurance purposes, using a retrofitted conventional ELD. The claimed subject matter reduces or eliminates the requirement that a new or fully simulated ELD is developed from scratch, solely for the purposes of a training simulation. The claimed subject matter also reduces or eliminates the requirement that a new or fully simulated ELD exhibits real time responses to a fully simulated electromagnetic field. Since a conventional retrofitted ELD is used, this is no longer a concern. Also, the use of a retrofitted conventional ELD is advantageous because it does not require that the trainee learn to use a simulated ELD that has no correspondence to a real or conventional ELD. Lastly, the use of a retrofitted conventional ELD is advantageous because it teaches field technicians to use conventional ELDs, which the field technician will encounter when performing buried asset locate procedures in the real world.

The claimed subject matter also improves over the prior art by providing a more efficient, automated, and precise way of measuring the performance of a field technician during a simulated buried asset locate procedure for quality control and quality assurance purposes. The example embodiments log a variety of data collected by the ELD during a simulated buried asset locate procedure and then determines the performance of the field technician, based on said collected data. The example embodiments leverage the vast amount of data that can be collected during a simulated buried asset locate procedure to assess and quantify a field technician's performance, as compared to industry standards for buried asset locate procedures and techniques. Hence, the example embodiments provide a complete picture of a field technician's performance during a simulated buried asset locate procedure, which may be used for training, evaluation, quality control and quality assurance purposes.

The claimed subject matter further improves over the prior art by providing a dual use ELD that can be used for both conventional buried asset locating and simulated buried asset locating. The claimed subject matter modifies the conventional ELD on a hardware level such that it can be used for both purposes at any time with the simple flip of a switch or software selection. This is advantageous for businesses that do not have large numbers of ELDs or that simply do not have an ELD to spare for training tasks. This can also be advantageous for smaller businesses as it does not incapacitate a conventional ELD (for conventional buried asset location tasks) with a large price tag. Lastly, the claimed subject matter is both efficient and optimal as the dual use nature of the ELD reduces or eliminates instances where the ELD may lay unused for long periods of time.

FIG. 1A is a diagram of an operating environment 100 that supports a system for simulating a buried asset location procedure in a defined space, according to an example embodiment. The server or computing system 102 may be communicatively coupled with a display 120, according to an example embodiment. The environment 100 may comprise a retrofitted conventional ELD 101, which detects, and measures simulated radio frequency and/or electromagnetic signals emanating from the computing system 102, as a simulated buried asset. In one embodiment, ELD 101 includes all of the functions of a conventional ELD, which is well known in the art. ELD 101 is also connected either wirelessly or in a wired or fiber optic form to the computing system 102. The environment 100 also shows that mobile ELD 101 is operated by a technician or operator 110 (i.e., a field technician) in training. Computing system 102, and ELD 101 may each comprise a computing device 600, described below in greater detail with respect to FIG. 6.

In one embodiment, a conventional ELD is defined as a handheld cable locator well known in the art, wherein the cable locator includes a series of antennas that take electromagnetic readings emanating from a buried asset, and wherein the cable locator processes said readings, and then displays information about said readings on a display for a technician to view. In another embodiment, the system 100 also calculates the current position, or local position, and orientation of the ELD 101 in the area 107. Server 102 may calculate the current position, or local position, and orientation of the ELD 101 in the area 107. Alternatively, the current position, or local position, and orientation of the ELD 101 is calculated by the ELD 101 and transmitted to the computing system 102, via RF or via a wired connection, along with other position relevant sensory data (and packaged in data packet 206). In one embodiment, a separate module, comprising an autonomous computing device, coupled to the ELD 101 performs the functions related to calculating the position and orientation of the ELD 101 in the area 107, as described above.

In one embodiment, the computing system 102 emits, via RF, a simulated electromagnetic field that corresponds to a field training scenario. That is, the computing system 102 includes a variety of field training scenarios wherein one or more buried assets, and their locations in area 107 are defined for each field training scenario. Also, computing system 102 calculates the strength, magnitude and frequency of the simulated electromagnetic field that corresponds to each field training scenario at each point in the area 107. When the computing system 102 receives the current position and orientation of the ELD 101, as described above, the computing system 102 transmits to the ELD 101, via RF, the strength, magnitude and frequency of the simulated electromagnetic field that corresponds to the current position and orientation of the ELD 101 in said particular field training scenario. Subsequently, the ELD 101 receives the simulated electromagnetic field that corresponds to the current position and orientation of the ELD 101 in said particular field training scenario and reacts accordingly.

Computing system 102 includes a software engine that delivers applications, data, program code and other information to networked devices, such as 120, 101. The software engine of computing system 102 may perform other processes such as transferring multimedia data in a stream of packets that are interpreted and rendered by a software application as the packets arrive. FIG. 1 further shows that computing system 102 includes a database or repository 104, which may be a relational database comprising a Structured Query Language (SQL) database stored in a SQL server. Computing device 101 may also include its own database, either locally or via the cloud. The database 104 may serve buried asset data, field training scenario data, buried asset locate performance data, as well as related information, which may be used by computing devices 102, 120 and 101.

Computing system 102 and ELD 101 may each include program logic comprising computer source code, scripting language code or interpreted language code that perform various functions of the disclosed embodiments. In one embodiment, the aforementioned program logic may comprise program module 607 in FIG. 6. It should be noted that although FIG. 1 shows only one computing system 102 and one ELD 101, the system of the disclosed embodiments supports any number of servers, ELDs and mobile computing devices connected via a network. Also note that although computing system 102 is shown as a single and independent entity, in one embodiment, computing system 102 and its functionality can be realized in a centralized fashion in one computer system or in a distributed fashion wherein different elements are spread across several interconnected computer systems.

Environment 100 may be used when devices 120, 102, 105, 101 engage in simulated buried asset detection activities that comprise reading, generating, and storing buried asset data and related information. Various types of data may be stored in the database 104 of device 102 (as well as data storage on devices 120 and ELD 101) with relation to a simulated buried asset that is being detected and located. For example, the database 104 (or devices 120 and ELD 101) may store one or more records for each simulated buried asset, and each record may include one or more buried asset data points. A buried asset data point may include a current time, a textual map address, and location data or position data, such as latitude and longitude coordinates, geographical coordinates, an altitude coordinate, or the like. A buried asset data point may also include depth measurement data, electromagnetic signal measurement data (such as electrical current measurement data, resistance measurement data, impedance measurement data, electrical signal magnitude measurement data, electrical signal frequency measurement data, electrical signal voltage measurement data, etc.), direction data and orientation data. Each record may include data for one buried asset data point.

Database 104 may also include a plurality of simulated field scenario records. A simulated field scenario record comprises a definition for one or more buried assets in a defined area 107, and the locations or positions in area 107. Also, a simulated field scenario record comprises data and attributes for each of the one or more buried assets in the defined area 107, such as type, size, electrical current, voltage, magnitude of current, frequency, direction, orientation, depth, etc.

Database 104 may also include a plurality of locate performance records. A locate performance record comprises real time sensor and data fusion derived from multiple sensors and inputs that enable inertial motion capture, electromagnetic locate signal analysis, position data, and mode configuration data, among other things. Database 104 may include one or more a lookup tables that define a correspondence between each one of a plurality of component values of a performance record and one of a plurality of performance measurements of a buried asset location procedure performed by a field technician. Said lookup tables may represent industry standards for buried asset location procedure and technique. I.e., said lookup tables may represent a benchmark against which a locate technician's performance can be compared. A performance measurement may be a graduating or continuous numerical scale, such as from 1 to 10, wherein 1 is considered low performance and 10 is considered excellent performance. A performance measurement may also be a set of words, for example, wherein the word BAD is considered low performance and the word GOOD is considered excellent performance. Note that in this description, any of the data described as stored in database 104 may also be stored in devices 120 and/or 101.

FIG. 1B is a diagram of a conventional operating environment for a standard buried asset location procedure. FIG. 1B shows a conventional ELD 190, which detects and measures radio frequency and/or electromagnetic signals 140 emanating from a buried asset 130. ELD 101 includes all the functions of a conventional locator device, which is well known in the art. As shown in FIG. 1B, conventional training of a field technician 110 requires that an actual buried asset 130 is buried underground, such that the ELD 190 may detect the EM signals 140 emanating from the asset 130. This illustrates the problem with using a conventional training scenario to train field technicians. Since the cost of burying actual operating buried assets is very high, as well as time consuming, said conventional training scenarios are often not feasible. Furthermore, when assets are buried for the purposes of training technicians, the buried assets are stationary and do not move over time, making the test scenarios stale and well known to the test takers over time. Note that the dual use nature of the ELD 101 results in said ELD have the capabilities of conventional ELD 190, which detects and measures radio frequency and/or electromagnetic signals 140 emanating from a buried asset 130.

Figure 1C:
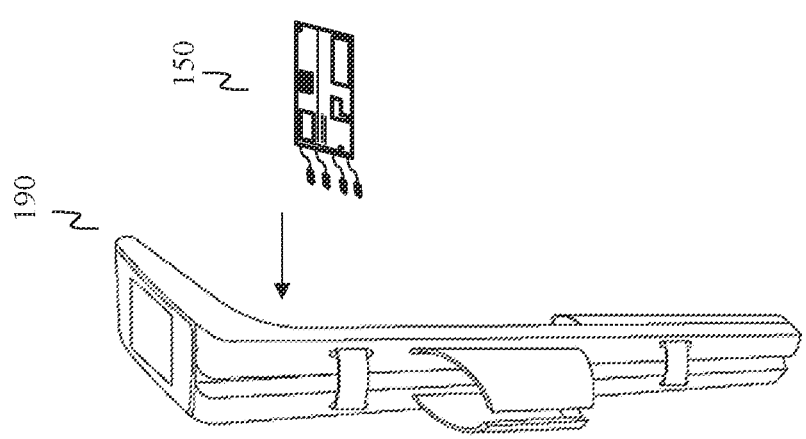
FIG. 1C is an illustration of a conventional ELD, showing the PCBA being installed for retrofitting the conventional ELD, according to an example embodiment.

FIG. 1C is an illustration of a conventional ELD 190, showing the PCBA 150 being installed for retrofitting the conventional ELD, according to an example embodiment. The PCBA 150 may also be said to customize the conventional ELD with additional functionality, to outfit the conventional ELD with additional functionality, to modernize the conventional ELD to include additional functionality or to overhaul the conventional ELD to include additional functionality. A printed circuit board (PCB) mechanically supports and electrically connects electronic components using conductive tracks, pads and other features etched from copper sheets laminated onto a non-conductive substrate. Electrical components (e.g. capacitors, resistors, or active devices) are generally soldered on the PCB. A PCB populated with said electronic components is referred to as a printed circuit assembly, a printed circuit board assembly (PCBA), a circuit card assembly, an expansion card or simply as a "card." Since the claimed subject matter pertains to a PCBA that retrofits conventional ELDs to operate in a simulated environment, as well as with quality control and quality assurance processes, the claimed subject matter may be referred to as a retrofit card.

FIG. 1C shows that the PCBA 150 may be coupled to the existing electronic infrastructure of the conventional ELD 190. The conventional ELD 190 may be disassembled, for example, by removing a back cover or back plate of the ELD, so as to gain access to its inner volume. The PCBA 150 may then be conductively coupled to the existing electronic infrastructure of the conventional ELD 190, and physically fastened to the body of the ELD. The PCBA 150 is described in greater detail below.

Figure 1D:
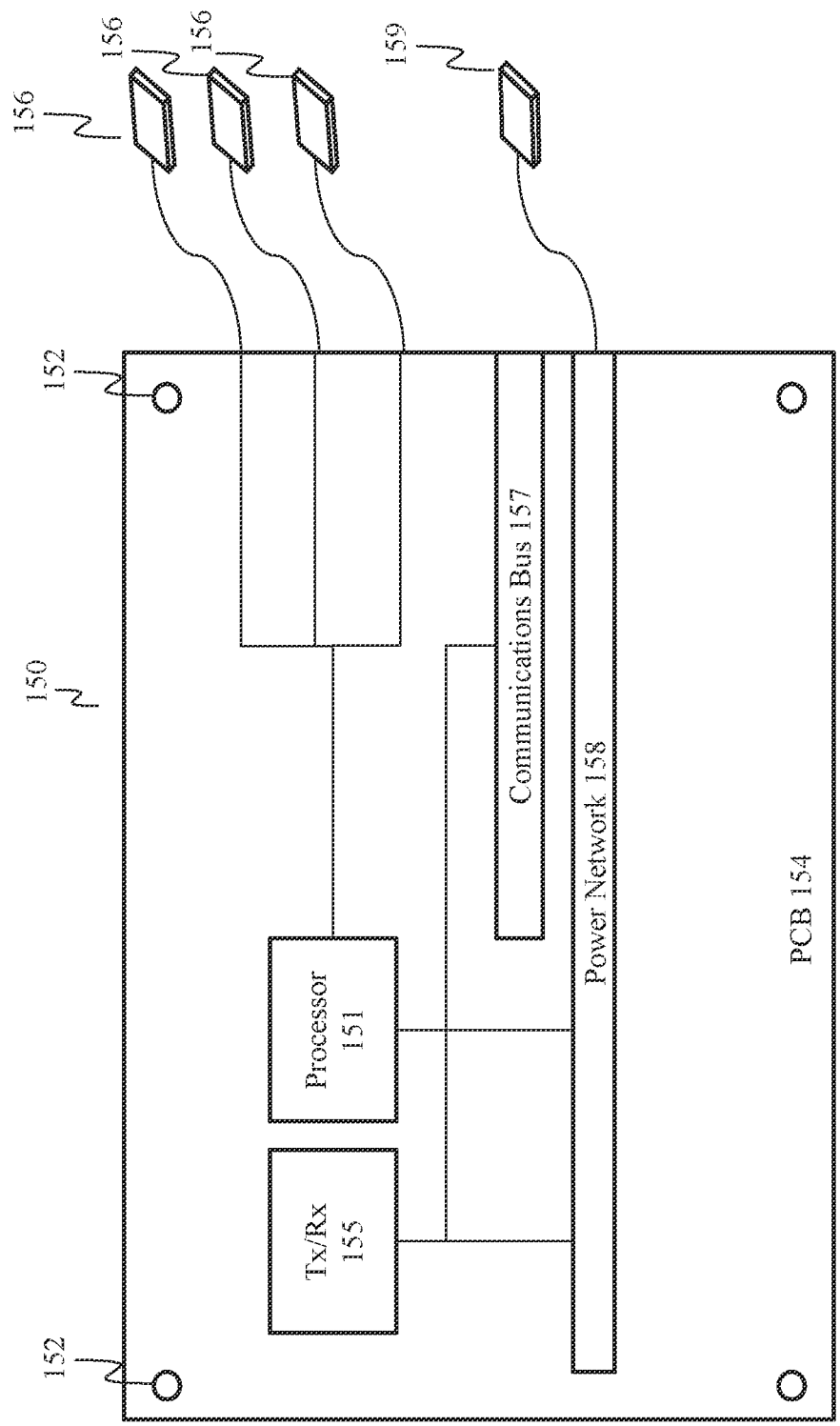
FIG. 1D is an illustration of the PCBA for retrofitting the conventional ELD, showing the internal components of the PCBA, according to an example embodiment.

FIG. 1D is an illustration of the PCBA 150 for retrofitting the conventional ELD 190, showing the internal components of the PCBA, according to an example embodiment. FIG. 1D shows that the PCBA 150 includes a PCB 154 including a plurality of electrical components. The PCBA includes one or more orifices 152 in the PCB configured for fastening to the conventional ELD. The orifices 152 may also include a standoff that is used to mount the PCBA to existing mounting positions in the interior volume of the conventional ELD. A standoff may be a raised cylinder including a threaded interior, wherein a bolt is screwed into the standoff and extended through an orifice in the ELD, so as to attach or fasten the PCBA to the ELD. The PCBA also includes a communications bus 157 for transferring data and a power network 158 for distributing power within the PCBA and for pulling power from an external node into the PCBA. The communications bus is a communication system that transfers data between components inside the PCBA, or between the PCBA and external nodes. The communications bus includes all related hardware components (wire, optical fiber, etc.) and software, including communication protocols.

The PCBA also includes a plurality of data connectors 156, each for communicatively coupling with the conventional ELD. Specifically, each data connector 156 is configured for connecting to the digital signal processor 163 in the conventional ELD, so as to replace an antenna coil (or more elements), as explained in more detail below. Each data connector 156 may act as a signal generator that emulates the signal generated by a coil antenna (or another component downstream from a coil antenna). The PCBA also includes a power connector 159 configured for conductively coupling the power network 158 with a power network on the conventional ELD.

The PCBA also includes a low-power radio frequency (RF) transmitter/receiver 155 communicatively coupled with the communications bus 157 and conductively coupled with the power network 158. The RF transmitter/receiver is configured for transmitting and receiving data over RF. The RF transmitter/receiver may be one or more of any of the commercially available chipsets and modules for exchanging data over short distances, such as a Bluetooth chipset. The PCBA also includes a processor 151 communicatively coupled with the communications bus 157 and conductively coupled with the power network 157. The functionality of processor 151 is described in greater detail below.

The PCBA may also include a user activated switch which may be a hardware switch (also described below), which is an electrical component that can disconnect or connect the conducting path in an electrical circuit, diverting it from one conductor to another. The switch may be an electromechanical device consisting of one or more sets of movable electrical contacts connected to external circuits. When a pair of contacts is touching current can pass between them, while when the contacts are separated no current can flow. The hardware switch may switch or divert the conducting path of 156, 159 such that signals transmitted via 156, 159 may or may not travel to the ELD 101. The hardware switch may switch the mode of the ELD from conventional buried asset locating mode to simulating mode. Alternatively, the switch may be software enabled, in the sense that the switch may be implemented in software, such that software may control the conducting path of 156, 159 such that signals transmitted via 156, 159 may or may not travel to the ELD 101 and such that software may switch the mode of the ELD from conventional buried asset locating mode to simulating mode according to a user command. In this alternative, the software enabled switch may be activated or deactivated by the user interacting with an interface, such as the interfaces described in FIGS. 4 and 5, the user interacting with a button or other user input/output devices on the ELD 101.

The PCBA 150 reads the emulated EM field data 208 received by the RF receiver 155, wherein the EM field data comprises at least three constituent parts, wherein each constituent part corresponds to EM field data for a specific one of the at least three antenna coils 160 on the conventional ELD. The PCBA 150 then: 1) disassembles the emulated EM field data into said at least three constituent parts, 2) generates a separate signal (three total) corresponding to each of the constituent parts, wherein each signal corresponds to one of the antenna coils 160, and wherein each signal emulates the signal produced by a coil antenna 160 (or another element downstream from said antenna coil) in the conventional ELD, and 3) transmits each of the three signals to a corresponding digital signal processor 163 (of three DSP's total) on the ELD 101, via the at least three data connectors 156. The signals provided to each digital signal processor 163 emulates an EM field on the ELD 101.

FIG. 1E is a diagram of a conventional ELD 190. FIG. 1E shows that conventional ELD 190 includes three or more coil antennas 196, 197, 198 located along a vertical shaft with a vertical separation between each one. Each coil antenna is configured to detect an electromagnetic field, as is well known in the art. Each coil antenna may be oriented in either a horizontal or vertical orientation and may comprise a ferrite rod surrounded by a predefined number of turns of wire. As the ELD is repositioned directly over the buried asset, since the signal strength of the electromagnetic radiation from the buried asset attenuates with the distance traveled, EM field strength measurements taken at known elevations can be used to compute the depth of the buried asset. A display head 195 includes all the operating electronics, bubble-level, user display, and batteries for the ELD.

Figure 1F:
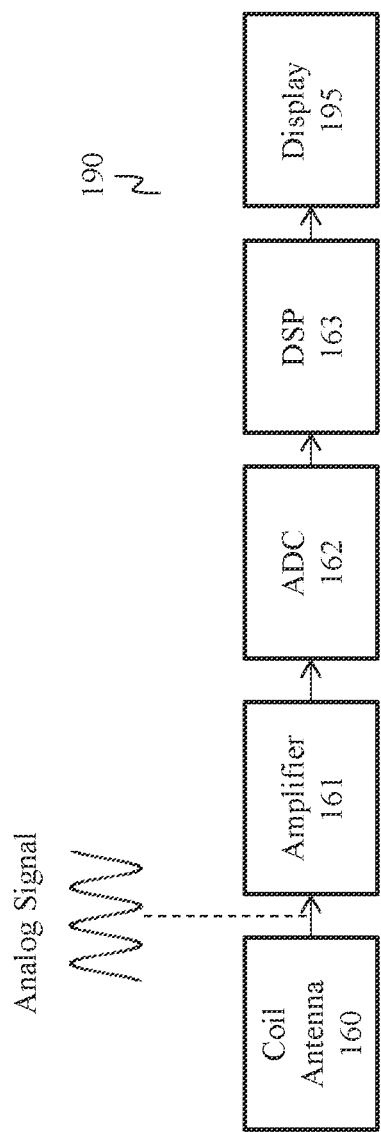
FIG. 1F is a block diagram showing the internal components of a conventional ELD.

FIG. 1F is a block diagram showing the internal components of a conventional ELD 190. The conventional ELD 190 shows that a coil antenna 160, as described above, produces an analog signal as a result of detecting an EM field. Said analog signal is then amplified by an amplifier 161, which analog signal is then converted to a digital signal by the analog to digital converter 162. Subsequently, the digital signal processor 163 then processes the digital signal produced by the ADC 162, wherein the DSP generates the data that is then used by the processor of the ELD 190 to display measurements, such as depth, current, etc., on a display 195. Note that although FIG. 1F shows one set of items 160, 161, 162 163, there can be any number of said sets, depending on how many coil antennas there are. If there are three coil antennas, there will be three sets of items 160, 161, 162 163, all of which are communicatively coupled with the display 195.

Figure 1G:
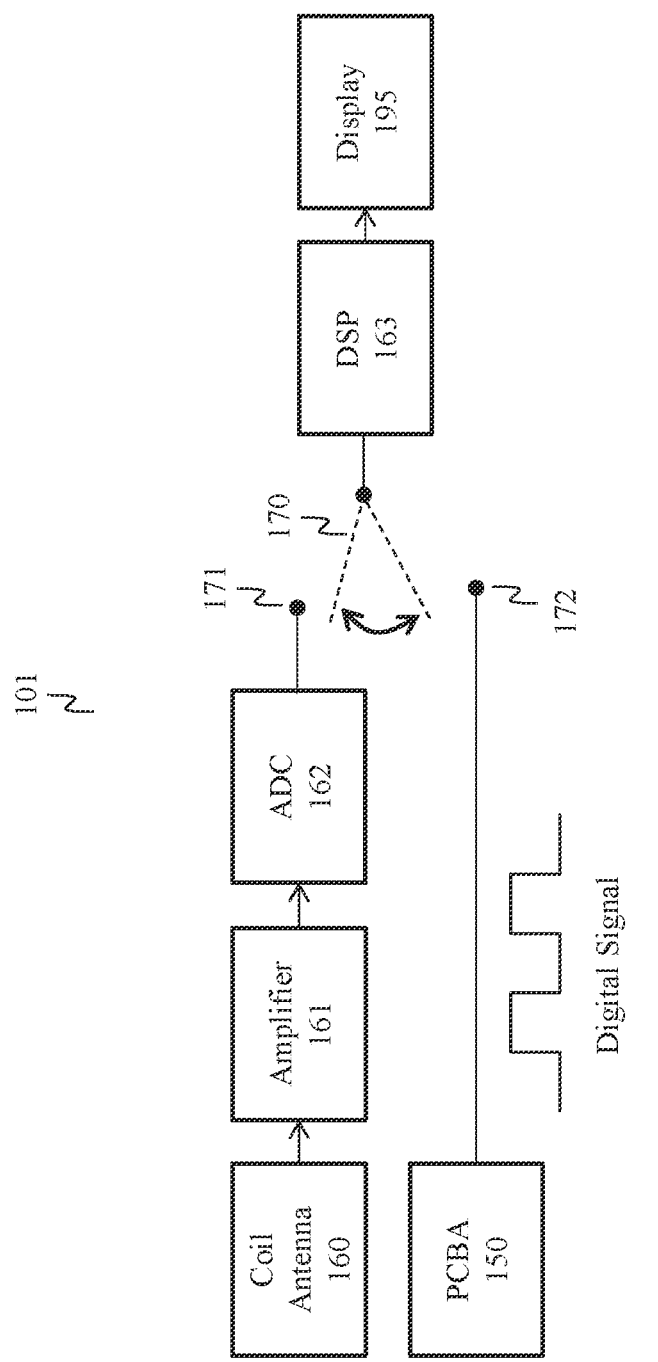
FIG. 1G is a block diagram showing the internal components of a retrofitted conventional ELD, according to an example embodiment.

FIG. 1G is a block diagram showing the internal components of a retrofitted conventional ELD 190, according to an example embodiment. The retrofitted ELD 101 shows that the PCBA 150 provides a digital signal that emulates the signal produced by the analog to digital converter 162 located downstream from the coil antenna 160. The signal provided by the PCBA 150 need not be amplified by an amplifier 161 or converted to a digital signal by the analog to digital converter 162. Subsequently, when in simulation mode, the digital signal processor 163 processes the digital signal directly produced by the PCBA 150, wherein the DSP generates the data that is then used by the processor of the ELD 190 to display measurements on display 195. Consequently, one of the advantages of the claimed embodiments is that, when in simulation mode, the amplification and analog-to-digital functions performed by elements 161, 162 are no longer needed, since the PCBA 150 produces exactly the type of signal needed by the DSP 163. Thus, when in simulation mode, the processing burden is offloaded from the ELD 101 to the PCBA 150, thereby freeing up resources on the ELD 101 to perform other functions.

As shown in FIG. 1G, the retrofitted ELD 101 essentially uses all of the components of the conventional ELD 190, except that there is a switch 170 that selects either the coil antenna 160, amplifier 161 and ADC 162 (when in the conventional buried asset locating mode) or the PCBA 150 (when in simulation mode). The PCBA 150 provides a digital signal that emulates the digital signal produced by the ADC 162, which is located downstream from the coil antenna 160. The PCBA 150 receives from the computing system 102, via RF, the strength, magnitude and frequency of the simulated electromagnetic field that corresponds to the current position and orientation of the ELD 101 in said particular field training scenario (in area 107). Subsequently, the PCBA 150 receives the simulated electromagnetic field that corresponds to the current position and orientation of the ELD 101 in said particular field training scenario and produces a signal that emulates the digital signal produced by the ADC 162, which is located downstream from the coil antenna 160. This signal is then processed by the remaining components of the ELD 101, which operate as if the ELD had received an actual signal from a coil antenna.

Thus, the aforementioned features reduce or eliminates the requirement that a new or fully simulated ELD is developed from scratch, since the claimed embodiments utilize a conventional ELD that is simply retrofitted. The aforementioned features further allows for the to both conduct a conventional buried asset locate procedure and engage in simulated training scenarios, all while using the same ELD. This is advantageous as it eliminates the need for two different devices to perform conventional buried asset locate procedures and engage in simulated training scenarios. The aforementioned features also result in a retrofitted ELD that exhibits real time responses to a fully simulated electromagnetic field. Also, the use of a retrofitted conventional ELD is advantageous because it does not require that the trainee learn to use a simulated ELD that has no correspondence to a real or conventional ELD.

FIG. 1G also shows a switch 170, which may be a hardware or software enabled switch that can switch or divert the conducting path of 156, 159 such that signals transmitted via 156, 159 may or may not travel to the ELD 101. The switch may also switch the mode of the ELD 101 from conventional buried asset locating mode to simulating mode. In conventional buried asset locating mode, the switch 170 is activated such that there is a conducting path from elements 160 to 161 to 162 and finally to 163, which matches the conducting path of the ELD 190, such that ELD 101 operates as a conventional ELD. In simulating mode, the switch 170 is activated such that there is a conducting path from elements 150 to 163 (via 156), such that ELD 101 operates in a simulation system, as described herein. In this way, the ELD 101 is dual use in that it can be used for both conventional buried asset locating and for simulation/training, thereby increasing the usability and functionality of the ELD 101. The mode of the ELD 101 may be switched from one mode to the other quickly and easily. When the switch 170 is in conventional buried asset locating mode, the switch 170 is activated such that it completes a conducting path with node 171. When the switch 170 is in simulating mode, the switch 170 is activated such that it completes a conducting path with node 172. It should be noted that although FIGS. 1F and 1G show only one set of items 160, 161, 162, 163, the claimed embodiments support any number of sets of items 160, 161, 162, 163. In an embodiment where there are three sets of items 160, 161, 162, 163, then in conventional buried asset locating mode, the switch 170 is activated such that the three data connectors 156 are decoupled and instead each set of items 160, 161, 162 is connected to one of three DSPs 163. In this embodiment, in simulating mode, the switch 170 is activated such that each of the three data connectors 156 are connected to one of three DSPs 163.

Alternatively, the switch 170 may be software enabled, in the sense that the switch may be implemented in software, such that software may control the actuating/activating (or "switching on") and deactivating (or "switching off") of the conventional buried asset locating functions when in conventional buried asset locating mode, and the simulating functions when in simulating mode. The software enabled switch may switch the mode of the ELD from conventional buried asset locating mode to simulating mode. The switch 170 may be present in the ELD 101 or may be present on the PCBA 150, as described above.

Figure 2:
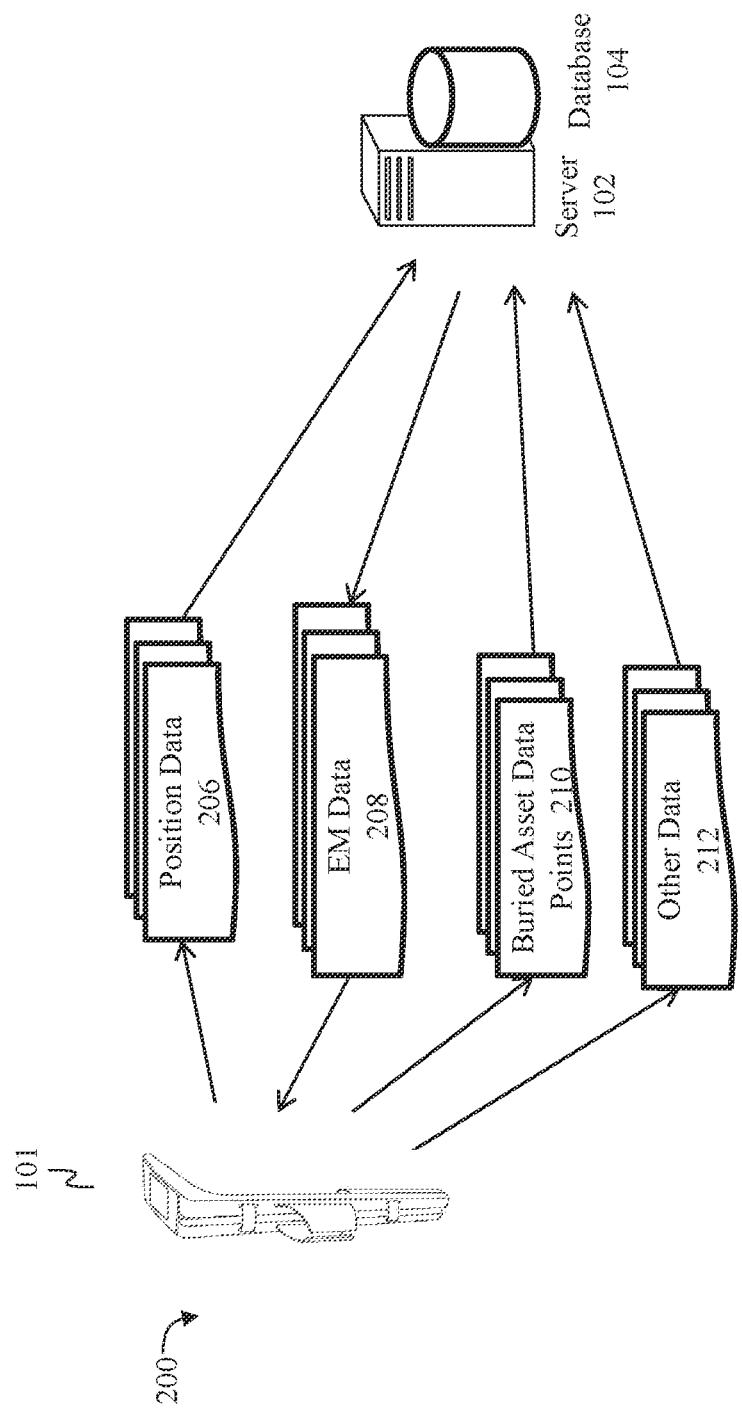
FIG. 2 is a diagram showing the data flow of the general process for simulating a buried asset location procedure in a defined space, according to an example embodiment.
Figure 3:
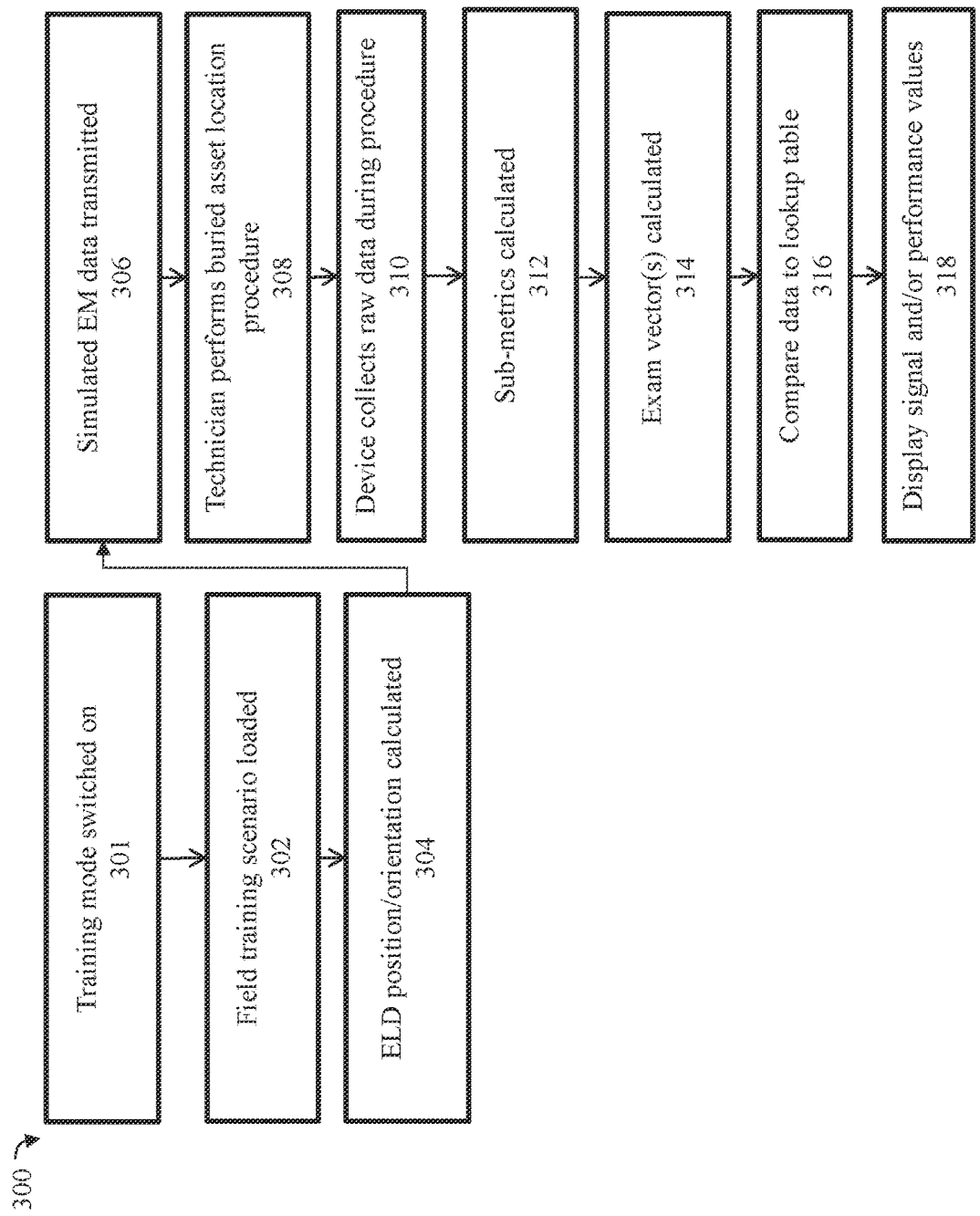
FIG. 3 is a flow chart showing the control flow of the process for simulating a buried asset location procedure in a defined space, according to an example embodiment.

FIG. 3 is a flow chart showing the control flow of the process for simulating a buried asset location procedure in a defined space, according to an example embodiment. Process 300 describes the steps that begin to occur when the locate technician 110 starts the process detecting and identifying a simulated buried asset located within an area 107. The process 300 is described with reference to FIG. 2, which shows the general data flow 200 of the process 300.

Prior to the beginning of the process 300, it is assumed that stored in database 104 is one or more lookup tables, as described above. Also prior to the beginning of the process 300, it is assumed that stored in database 104 is field training scenarios, as described above.

Process 300 starts in earnest with step 301, wherein the switch 170 is activated such that there is a conducting path from elements 150 to 170 to 162 and finally to 163, such that ELD 101 operates in a simulation system, as described herein. Then, in step 302, a field training scenario is selected and loaded into the system 102. In step 304, ELD 101 calculates its orientation and position data 206 in area 107. The calculated position/orientation data 206 may be sent by the ELD 101 to the computing system 102, via RF or via a wired connection, along with other position relevant sensory data.

Then, in step 306, the computing system 102 emits, via RF, simulated electromagnetic field data 208 that corresponds to the selected field training scenario. The computing system 102 calculates the strength, magnitude and frequency of the simulated electromagnetic field that corresponds to each field training scenario at each point in the area 107. When the computing system 102 receives the current position and orientation of the ELD 101, as described above, the computing system 102 transmits to the ELD 101, via RF, the strength, magnitude and frequency of the simulated electromagnetic field that corresponds to the current position and orientation of the ELD 101 in said particular field training scenario. Subsequently, the ELD 101 receives the simulated electromagnetic field data 208 that corresponds to the current position and orientation of the ELD 101 in said particular field training scenario and reacts accordingly.

Specifically, the PCBA 150 reads the emulated EM field data 208 received by the RF receiver 155, wherein the EM field data comprises at least three constituent parts, wherein each constituent part corresponds to EM field data for a specific one of the at least three antenna coils 160 on the conventional ELD. The PCBA 150 then: 1) disassembles the emulated EM field data into said at least three constituent parts, 2) generates a separate signal (three total) corresponding to each of the constituent parts, wherein each signal corresponds to one of the antenna coils 160, and wherein each signal emulates the signal produced by a coil antenna 160 (or another element downstream from said antenna coil) in the conventional ELD, and 3) transmits each of the three signals to a corresponding digital signal processor 163 on the ELD 101, via the at least three data connectors 156. The signals provided to each digital signal processor 163 emulates an EM field on the ELD 101.

In step 308, the technician 110 performs a simulated buried asset location procedure using his ELD 101. The ELD 101 generates buried asset data and/or buried asset data points 210. Based on the data it has received and calculated, ELD 101 calculates one or more buried asset data points 210 for the simulated buried asset. Upon generating the buried asset data points, the technician may place physical or virtual markings on the ground corresponding to each point, such as a (simulated) flag, a (simulated) paint mark or a combination of the two. The system 102 receives the buried asset data and/or buried asset data points 210 and creates records in the database 104 to hold said data.

In one embodiment, the ELD 101 generates other data 212, which is transmitted to the system 102. The system 102 receives the other 212 and stores said data in related records in the database 104. The other data 212 may include data that defines where and when the technician placed physical or virtual markings on the ground corresponding to each buried asset data point, such as a (simulated) flag, a (simulated) paint mark or a combination of the two. The other data 212 may also include data related to the peak or null readings or points read by the ELD 101, as well as the mode of operation of the ELD 101.

In step 310, ELD 101 collects the following raw data produced by the ELD as a result of performance of the buried asset location procedure by the field technician 110: 1) motion data from an accelerometer and a gyroscope in the ELD, and wherein said motion data includes motion in three dimensions, and wherein said motion data is produced as a result of movement of the ELD by the field technician during performance of the buried asset location procedure (may also be garnered from rotation or tilt sensor), 2) electromagnetic data from one or more electromagnetic sensors in the ELD, wherein said electromagnetic data includes current and depth measurements, as well as device gain and full scale deflection data, and wherein said electromagnetic data is produced as a result of movement of the ELD by the field technician during performance of the buried asset location procedure, 3) a mode of the ELD, wherein the mode includes a frequency mode of the ELD, and wherein the mode is set by the field technician during performance of the buried asset location procedure, and 4) position data of the ELD in area 107.

Motion data may include the detection and logging of various vectors in all degrees of motion, velocity, and acceleration of the ELD. Electromagnetic data may include electrical current measurement data, resistance measurement data, impedance measurement data, electrical signal magnitude measurement data, electrical signal frequency measurement data, electrical signal voltage measurement data, etc. The electromagnetic data produced by the ELD may be displayed in the ELD, wherein motion data (leading up to the logging of the electromagnetic data) from the accelerometer and gyroscope in the ELD is stored, such that said motion data may be evaluated to determine proper performance and procedure of the buried asset location procedure leading up to the logging of the electromagnetic data.

A mode of the ELD may include any one of a variety of modes (that are well-known in the art) in which a locator device may be placed. With regard to mode of the ELD, each ELD has various modes that the field technician selects depending on type of utility, type of environment, etc. These device mode selections include frequency selections to match transmitter selection, peak signal mode, null signal mode, peak and null signal modes simultaneously, line versus sonde/probe mode. Said device mode selections may define a locate device operating mode. Each ELD may also collect electromagnetic (EM) signal response data, which indicates how the locator device is responding to the electromagnetic signals (140) it is detecting and processing, as well as signal strength, signal direction (left right of target), system gain control, phase (direction) of signal, measured depth, measured current, etc. The raw data collected above is then used at a later point to generate performance measurements that represent the technician's performance during said buried asset location procedure, according to industry standards.

Next, in step 312, the devices 101 or 102 calculate sub-metrics based on the raw data collected above. In this step, the devices 101 or 102 calculate the following raw sub-metrics based on the data collected above, and uses said sub-metrics as the component values of a first quantity vector:

a) an alignment of acceleration of the ELD with gravity, calculated as $$\text{mean}\left(\frac{a \cdot g}{\|a\| \|g\|}\right),$$

b) magnitude of non-gravity acceleration of the ELD, calculated as rms ($\|\alpha\|-\|g\|$),
c) rotation of the ELD about its x-axis, calculated as rms ($\omega_x$),
d) rotation of the ELD about its y-axis, calculated as rms ($\omega_y$),
e) rotation of the ELD about its z-axis, calculated as rms ($\omega_z$).

wherein $\alpha$ may be a vector that represents acceleration, g may be a vector that represents gravity, rms stands for root mean squared and mean stands for a statistical mean.

Next, in step 314, the devices 101 or 102 calculate component values of a first exam vector based on the quantity vector, the first exam vector composed of the following components values:

a) a score based on whether the ELD is aligned with gravity, calculated based on $$\text{mean}\left(\frac{a \cdot g}{\|a\| \|g\|}\right),$$

b) a score based on magnitude of motion of the ELD, calculated based on rms ($\|\alpha\|-\|g\|$),
c) a score based on magnitude of rotation of the ELD about x-axis, calculated based on rms ($\omega_x$),
d) a score based on magnitude of rotation of the ELD about y-axis, calculated based on rms ($\omega_y$),
e) a score based on magnitude of rotation of the ELD about z-axis, calculated based on rms ($\omega_z$),
f) a score based on whether rotation of the ELD about the z-axis is dominant calculated based on rms ($\omega_z$), rms ($\omega_x$) and rms ($\omega_y$), wherein $\omega_y$ represents rotation about the y axis, $\omega_z$ represents rotation about the z axis and $\omega_x$ represents rotation about the x axis.

Each may be rotation vectors, and each may further represent an array of data representing rotation about a specific axis. In one embodiment, a score may be a numerical value, such as the numbers 0, 1 or 2. In another embodiment, a score is based on whether the resulting value is within certain ranges. For example, if rms ($\omega_x$) is calculated to be greater than 50 units per second, then a score of 2 is applied, if rms ($\omega_x$) is calculated to be between 18 and 50 units per second, then a score of 1 is applied, and if rms ($\omega_x$) is calculated to be less than 18 units per second, then a score of 0 is applied. This paradigm may be applied to all factors a) through f) above.

In step 316, the devices 101 or 102 access the lookup table, and read a performance measurement that corresponds with each one of the plurality of component values of the first exam record, so as to read a plurality of performance measurements. The result of this step is that a plurality of performance measurements is read and stored.

Alternatively, in step 316, the devices 101 or 102 access the lookup table, and read a performance measurement that corresponds with each one of said plurality of component values of the performance record of the field technician 110, so as to read a plurality of performance measurements.

In step 318, the devices 101 or 102 execute a visual or audio signal, if one or more of said plurality of performance measurements are below a given threshold, so as to notify the first field technician that performance of the buried asset location procedure by the first field technician is below said threshold. Also, the ELD may display (such as on display 120) the plurality of performance measurements, which indicates performance of the buried asset location procedure and technique of the first field technician according to said industry standards embedded in the lookup table.

The initial data collected above comprise the quality control aspect of the claimed subject matter. Quality control is a process by which entities review the quality of all factors involved in production by the field technicians. Part of said process includes automated inspection or review of the data collected above to determine whether said data meets industry standards.

Figure 4:
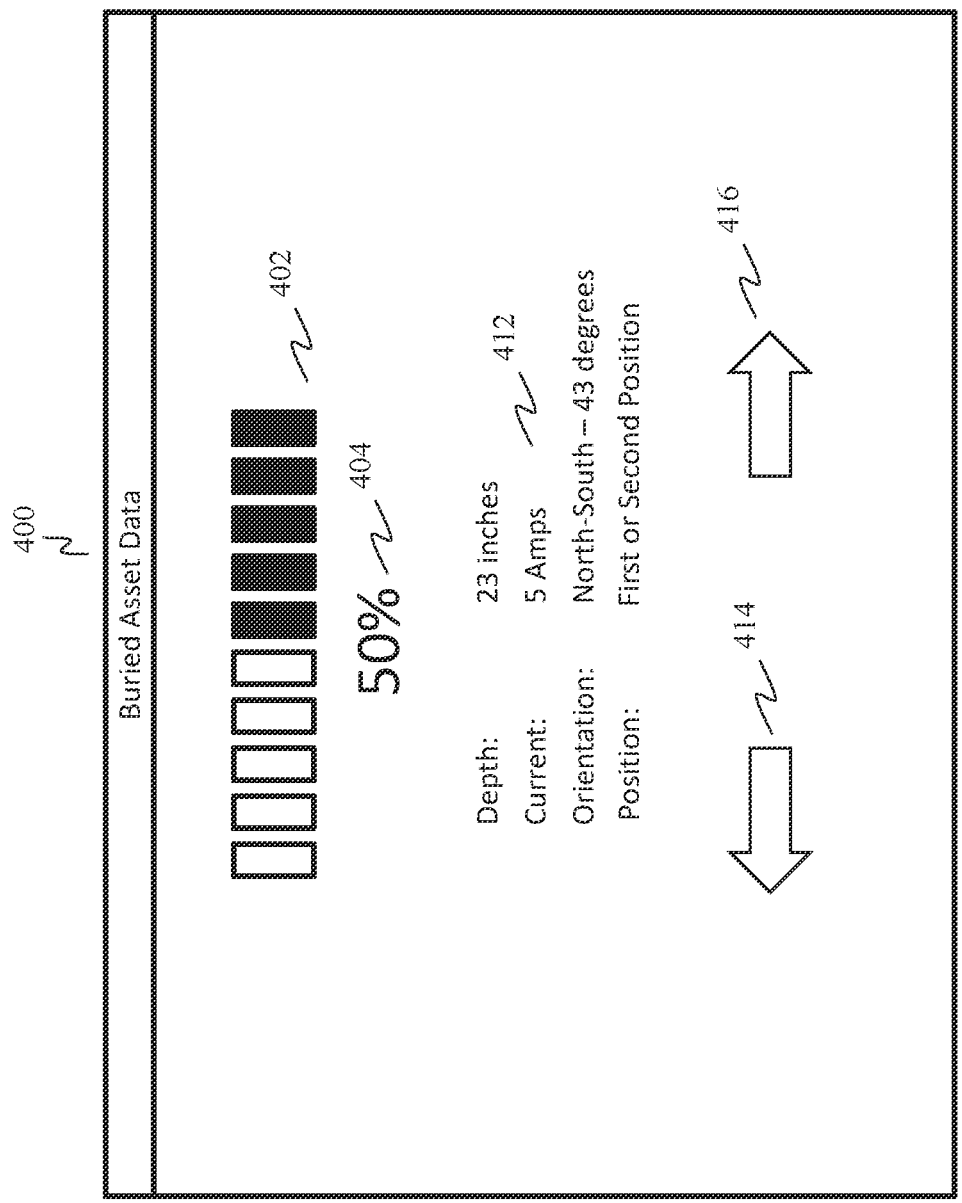
FIG. 4 is an illustration of a graphical user interface in an ELD that displays data associated with a buried asset location procedure.

FIG. 4 is an illustration of a graphical user interface 400 that displays data associated with the detection of buried asset data, according to an example embodiment. The graphical user interface 400 may apply to the ELD 101 and 190. The interface 400 may display buried asset data 412. Recall that buried asset data may include depth, position, electrical signal measurement (such as current, resistance, impedance, magnitude, frequency, voltage, etc.), direction and orientation.

Interface 400 may also include a graphic 402 that indicates the signal strength of the buried asset being detected (such as a meter reading comprising ten bars), and a numerical indicator 404 that indicates the signal strength of the buried asset being detected. In one embodiment, the ELD receives human readable buried asset data and based on the data received, the ELD calculates the appropriate graphic 402 or numerical indicator 404 to display in interface 400. For example, if the ELD receives human readable buried asset data indicating 50% signal strength, the ELD calculates the appropriate graphic 402 to display in interface 400 is five out of ten bars, which graphically indicates 50%. The interface 400 can also include the position the ELD is in so that the technician can confirm that the correct algorithm, process, software, filter etc. is applied to the data received by the ELD.

Lastly, the interface 400 may also include left and right arrows 414, 416, which points the technician in the direction of the location of the buried asset being detected. Left and right arrows 414, 416, may additionally indicate to the technician the direction in which the ELD should be moved in order to read increased signal strength from of the buried asset being detected.

Figure 5:
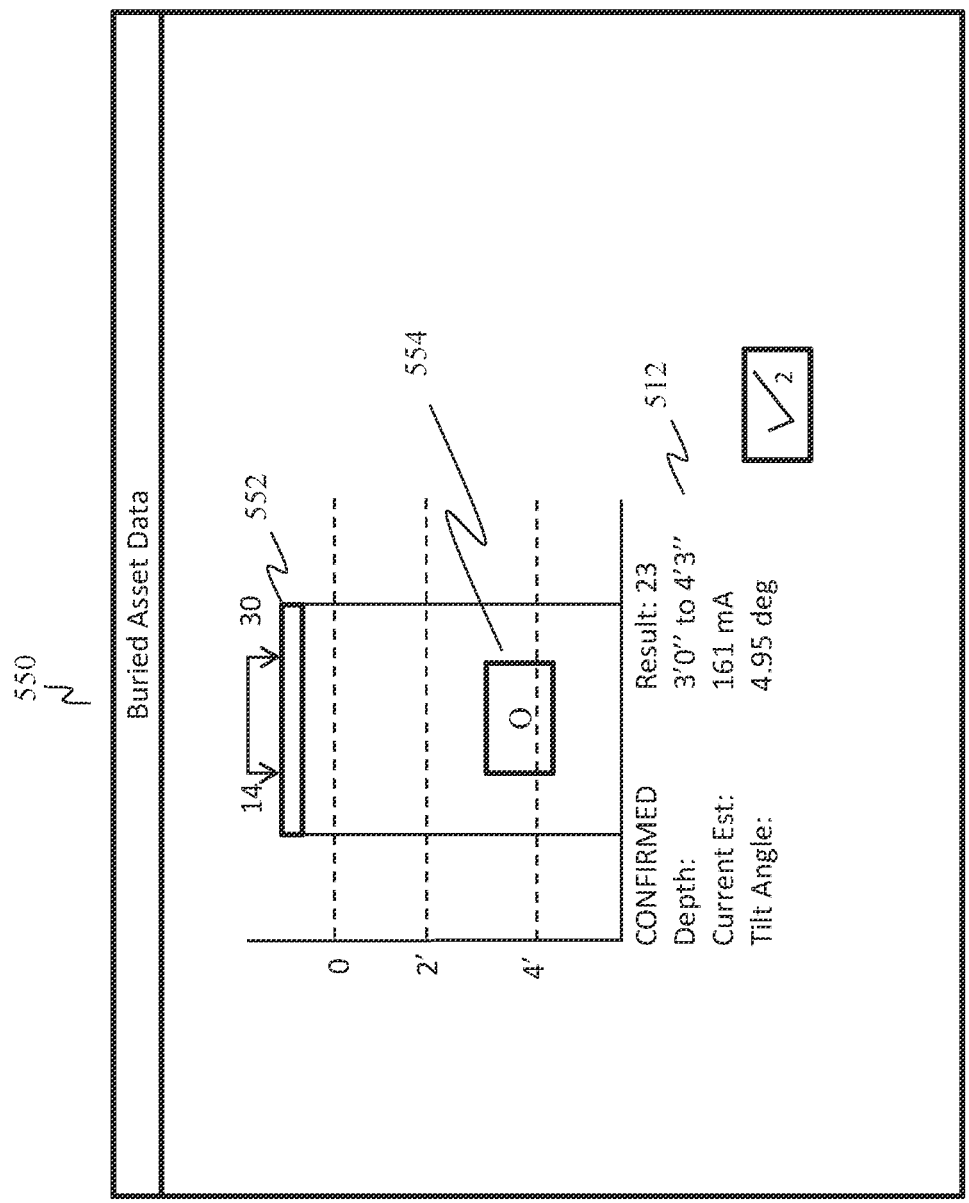
FIG. 5 is an illustration of an alternative graphical user interface in an ELD that displays data associated with a buried asset location procedure; and, FIG. 6 is a block diagram of a system including a computing device, according to an example embodiment.

FIG. 5 is an illustration of an alternative graphical user interface 550 that displays data associated with the detection of buried asset data, according to an example embodiment. The graphical user interface 550 may apply to the ELD 101 and 190. The interface 550 may display buried asset data 512. The interface 550 also shows a graphic 552 that indicates the position of a horizontally oriented ELD on the ground. Under the graphic 552 is a numbered graph that corresponds to the ground and the depth of said ground. The interface 550 also shows a graphic 554 that indicates the position of a buried asset under the ground.

Figure 6:
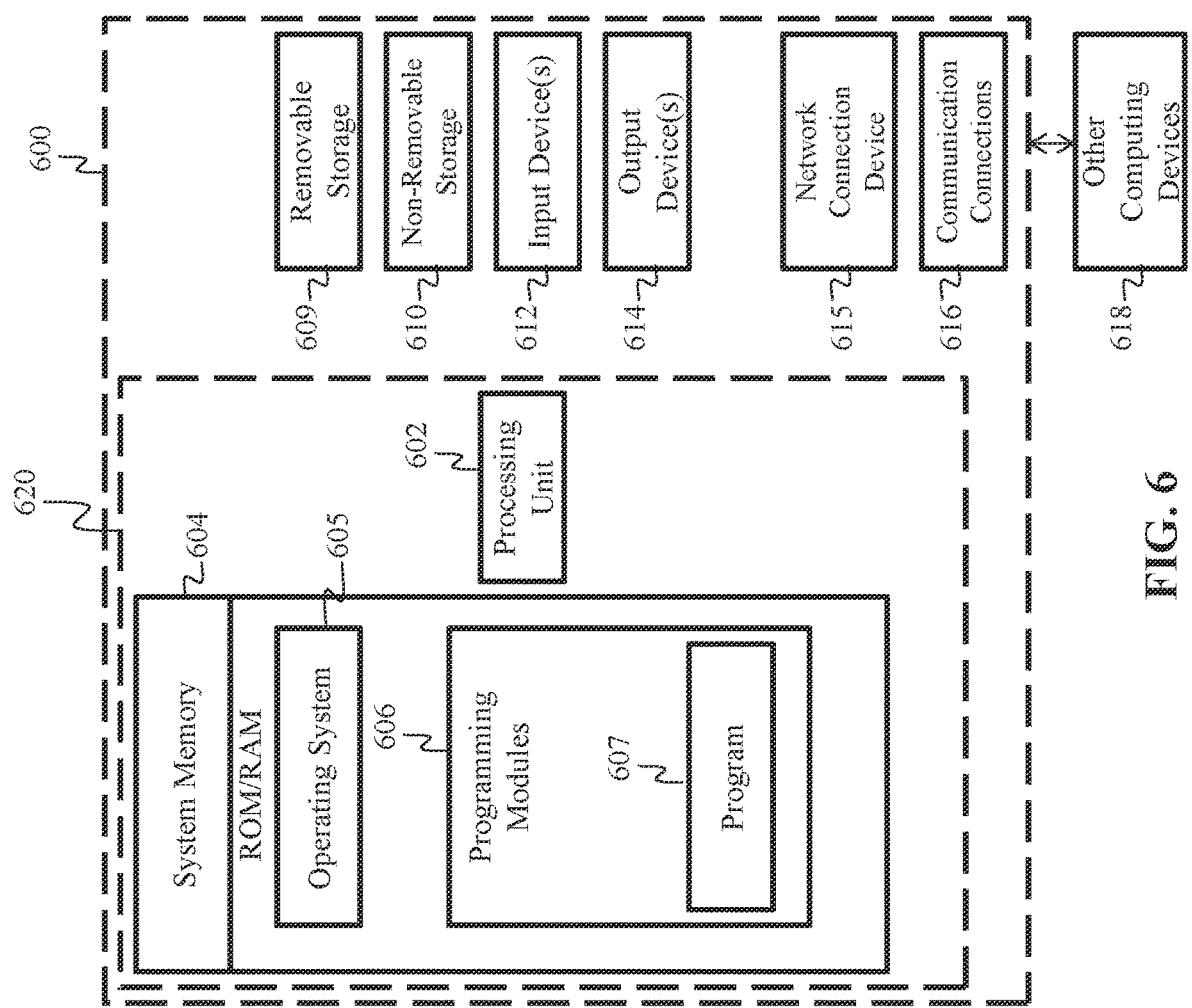

FIG. 6 is a block diagram of a system including an example computing device 600 and other computing devices. Consistent with the embodiments described herein, the aforementioned actions performed by devices 102, 101 and 150 may be implemented in a computing device, such as the computing device 600 of FIG. 6. Any suitable combination of hardware, software, or firmware may be used to implement the computing device 600. The aforementioned system, device, and processors are examples and other systems, devices, and processors may comprise the aforementioned computing device. Furthermore, computing device 600 may comprise an operating environment for system 100 and process 300, as described above. Process 300 may operate in other environments and are not limited to computing device 600.

With reference to FIG. 6, a system consistent with an embodiment may include a plurality of computing devices, such as computing device 600. In a basic configuration, computing device 600 may include at least one processing unit 602 and a system memory 604. Depending on the configuration and type of computing device, system memory 604 may comprise, but is not limited to, volatile (e.g. random access memory (RAM)), non-volatile (e.g. read-only memory (ROM)), flash memory, or any combination or memory). System memory 604 may include operating system 605, and one or more programming modules 606. Operating system 605, for example, may be suitable for controlling computing device 600's operation. In one embodiment, programming modules 606 may include, for example, a program module 607 for executing the actions of devices 102, 101 and 150. Furthermore, embodiments may be practiced in conjunction with a graphics library, other operating systems, or any other application program and is not limited to any particular application or system. This basic configuration is illustrated in FIG. 6 by those components within a dashed line 620.

Computing device 600 may have additional features or functionality. For example, computing device 600 may also include additional data storage devices (removable and/or non-removable) such as, for example, magnetic disks, optical disks, or tape. Such additional storage is illustrated in FIG. 6 by a removable storage 609 and a non-removable storage 610. Computer storage media may include volatile and nonvolatile, removable, and non-removable media implemented in any method or technology for storage of information, such as computer readable instructions, data structures, program modules, or other data. System memory 604, removable storage 609, and non-removable storage 610 are all computer storage media examples (i.e. memory storage.) Computer storage media may include, but is not limited to, RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store information and which can be accessed by computing device 600. Any such computer storage media may be part of device 600. Computing device 600 may also have input device(s) 612 such as a keyboard, a mouse, a pen, a sound input device, a camera, a touch input device, etc. Output device(s) 614 such as a display, speakers, a printer, etc. may also be included. Computing device 600 may also include a vibration device capable of initiating a vibration in the device on command, such as a mechanical vibrator or a vibrating alert motor. The aforementioned devices are only examples, and other devices may be added or substituted.

Computing device 600 may also contain a network connection device 615 that may allow device 600 to communicate with other computing devices 618, such as over a network in a distributed computing environment, for example, an intranet or the Internet. Device 615 may be a wired or wireless network interface controller, a network interface card, a network interface device, a network adapter, or a LAN adapter. Device 615 allows for a communication connection 616 for communicating with other computing devices 618. Communication connection 616 is one example of communication media. Communication media may typically be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media. The term computer readable media as used herein may include both computer storage media and communication media.

As stated above, a number of program modules and data files may be stored in system memory 604, including operating system 605. While executing on processing unit 602, programming modules 606 (e.g. program module 607) may perform processes including, for example, one or more of the stages of the process 300 as described above. The aforementioned processes are examples, and processing unit 602 may perform other processes. Other programming modules that may be used in accordance with embodiments herein may include electronic mail and contacts applications, word processing applications, spreadsheet applications, database applications, slide presentation applications, drawing or computer-aided application programs, etc.

Generally, consistent with embodiments herein, program modules may include routines, programs, components, data structures, and other types of structures that may perform particular tasks or that may implement particular abstract data types. Moreover, embodiments herein may be practiced with other computer system configurations, including handheld devices, multiprocessor systems, microprocessor-based or programmable consumer electronics, minicomputers, mainframe computers, and the like. Embodiments herein may also be practiced in distributed computing environments where tasks are performed by remote processing devices that are linked through a communications network. In a distributed computing environment, program modules may be located in both local and remote memory storage devices.

Furthermore, embodiments herein may be practiced in an electrical circuit comprising discrete electronic elements, packaged or integrated electronic chips containing logic gates, a circuit utilizing a microprocessor, or on a single chip (such as a System on Chip) containing electronic elements or microprocessors. Embodiments herein may also be practiced using other technologies capable of performing logical operations such as, for example, AND, OR, and NOT, including but not limited to mechanical, optical, fluidic, and quantum technologies. In addition, embodiments herein may be practiced within a general-purpose computer or in any other circuits or systems.

Embodiments herein, for example, are described above with reference to block diagrams and/or operational illustrations of methods, systems, and computer program products according to said embodiments. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While certain embodiments have been described, other embodiments may exist. Furthermore, although embodiments herein have been described as being associated with data stored in memory and other storage mediums, data can also be stored on or read from other types of computer-readable media, such as secondary storage devices, like hard disks, floppy disks, or a CD-ROM, or other forms of RAM or ROM. Further, the disclosed methods' stages may be modified in any manner, including by reordering stages and/or inserting or deleting stages, without departing from the claimed subject matter.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A printed circuit card assembly (PCBA) configured for retrofitting a conventional electromagnetic locator device (ELD) for a simulator system, the PCBA comprising:
   a printed circuit board (PCB) including a plurality of electrical components;
   at least one orifice in the PCB configured for fastening to the conventional ELD;
   a first communications bus for transferring data;
   a first power network for distributing power;
   a power connector configured for conductively coupling the first power network with a power network on the conventional ELD;
   at least three data connectors, each data connector configured for communicatively coupling with a separate one of at least three digital signal processors on the conventional ELD;
   a switch that, upon activation by the user, communicatively couples the at least three data connectors with the at least three digital signal processors;
   a low-power radio frequency (RF) receiver communicatively coupled with the first communications bus and conductively coupled with the first power network, the RF receiver configured for receiving, over RF, emulated electromagnetic (EM) field data;
   a processor communicatively coupled with the first communications bus and conductively coupled with the first power network, the processor configured for:
      a) reading the emulated EM field data received by the RF receiver, which comprises at least three constituent parts, wherein each constituent part corresponds to EM field data for a specific one of the at least three digital signal processors on the conventional ELD;
      b) disassembling the emulated EM field data into said at least three constituent parts; and
      c) transmitting an amplified digital signal to each one of the at least three digital signal processors on the conventional ELD, via the at least three data connectors, the constituent part of the emulated EM field data that corresponds to said digital signal processor, thereby emulating an EM field on the conventional ELD.

2. The PCBA of claim 1, wherein the switch is further configured such that, upon further activation by the user, said switch decouples the at least three data connectors from the at least three digital signal processors, and the switch couples the at least three digital signal processors to at least three analog to digital converters that are each communicatively coupled with a coil antenna on the conventional ELD.

3. A system for simulating a buried asset locate procedure, the system comprising:
   a conventional electromagnetic locator device (ELD);
   a printed circuit card assembly (PCBA) configured for outfitting the conventional ELD, the PCBA comprising:
      a printed circuit board (PCB) including a plurality of electrical components;
      at least one orifice in the PCB configured for fastening to the conventional ELD;
      a first communications bus for transferring data;
      a first power network for distributing power;
      a power connector configured for conductively coupling the first power network with a power network on the conventional ELD;

at least three data connectors, each data connector configured for communicatively coupling with a separate one of at least three digital signal processors on the conventional ELD;

a switch that, upon activation by the user, communicatively couples the at least three data connectors with the at least three digital signal processors;

a low-power radio frequency (RF) receiver communicatively coupled with the first communications bus and conductively coupled with the first power network, the RF receiver configured for receiving, over RF, emulated electromagnetic (EM) field data;

a processor communicatively coupled with the first communications bus and conductively coupled with the first power network, the processor configured for:
 a) reading the emulated EM field data received by the RF receiver, which comprises at least three constituent parts, wherein each constituent part corresponds to EM field data for a specific one of the at least three digital signal processors on the conventional ELD;
 b) disassembling the emulated EM field data into said at least three constituent parts;
 c) transmitting an amplified digital signal to each one of the at least three digital signal processors on the conventional ELD, via the at least three data connectors, the constituent part of the emulated EM field data that corresponds to said digital signal processor, thereby emulating an EM field on the conventional ELD.

4. The system of claim 3, wherein the conventional ELD comprises at least three analog to digital converters that are each communicatively coupled with a coil antenna.

5. The system of claim 4, wherein the switch is further configured such that, upon further activation by the user, said switch decouples the at least three data connectors from the at least three digital signal processors, and the switch couples the at least three digital signal processors to the at least three analog to digital converters on the conventional ELD.

6. A system for simulating a buried asset locate procedure, the system comprising:
 a conventional electromagnetic locator device (ELD);
 a computing system configured for: 1) loading a field training scenario comprising a description of one or more buried assets, 2) wirelessly receiving a current position and orientation of the ELD within a predefined area, 3) calculating emulated electromagnetic (EM) field data based on the current position and orientation of the ELD, and 4) wirelessly transmitting said emulated EM field data;
 a computing device coupled to the ELD, the computing device configured for determining a current position and orientation of the ELD, and wirelessly transmitting said current position and orientation of the ELD to the computing system;
 a printed circuit card assembly (PCBA) configured for modernizing the conventional ELD, the PCBA comprising:
  a printed circuit board (PCB) including a plurality of electrical components;
  at least one orifice in the PCB configured for fastening to the conventional ELD;
  a first communications bus for transferring data;
  a first power network for distributing power;
  a power connector configured for conductively coupling the first power network with a power network on the conventional ELD;
  at least three data connectors, each data connector configured for communicatively coupling with a separate one of at least three digital signal processors on the conventional ELD;
  a switch that, upon activation by the user, communicatively couples the at least three data connectors with the at least three digital signal processors;
  a low-power radio frequency (RF) receiver communicatively coupled with the first communications bus and conductively coupled with the first power network, the RF receiver configured for receiving, over RF, the emulated EM field data from the computing system;
  a processor communicatively coupled with the first communications bus and conductively coupled with the first power network, the processor configured for:
   a) reading the emulated EM field data received by the RF receiver, which comprises at least three constituent parts, wherein each constituent part corresponds to EM field data for a specific one of the at least three digital signal processors on the conventional ELD;
   b) disassembling the emulated EM field data into said at least three constituent parts;
   c) transmitting an amplified digital signal to each one of the at least three digital signal processors on the conventional ELD, via the at least three data connectors, the constituent part of the emulated EM field data that corresponds to said digital signal processor, thereby emulating an EM field on the conventional ELD.

7. The system of claim 6, wherein the conventional ELD comprises at least three analog to digital converters that are each communicatively coupled with a coil antenna.

8. The system of claim 7, wherein the switch is further configured such that, upon further activation by the user, said switch decouples the at least three data connectors from the at least three digital signal processors, and the switch couples the at least three digital signal processors to the at least three analog to digital converters on the conventional ELD.

* * * * *